United States Patent
Solomko et al.

(10) Patent No.: US 10,816,581 B2
(45) Date of Patent: Oct. 27, 2020

(54) RF IMPEDANCE MEASUREMENT AND TUNING SYSTEM

(71) Applicant: Infineon Technologies AG, Neubiberg (DE)

(72) Inventors: Valentyn Solomko, Munich (DE); Ruediger Bauder, Feldkirchen-Westerham (DE); Anthony Thomas, Munich (DE)

(73) Assignee: Infineon Technologies AG, Neubiberg (DE)

( * ) Notice: Subject to any disclaimer, the term of this patent is extended or adjusted under 35 U.S.C. 154(b) by 141 days.

(21) Appl. No.: 16/132,816

(22) Filed: Sep. 17, 2018

(65) Prior Publication Data

US 2020/0088773 A1   Mar. 19, 2020

(51) Int. Cl.
*G01R 27/06* (2006.01)
*H03H 7/40* (2006.01)
(Continued)

(52) U.S. Cl.
CPC .............. *G01R 27/06* (2013.01); *H03H 7/40* (2013.01); *H04B 1/0458* (2013.01); *H04B 1/3833* (2013.01)

(58) Field of Classification Search
CPC .......... G01R 27/06; G01R 27/16; H03H 7/40; H04B 1/0458; H04B 1/3833
(Continued)

(56) References Cited

U.S. PATENT DOCUMENTS

| 5,523,955 A * | 6/1996 | Heckman | H01J 37/32082 |
| | | | 315/111.31 |
| 7,586,384 B2 * | 9/2009 | Ranta | H03H 7/38 |
| | | | 333/17.3 |

(Continued)

FOREIGN PATENT DOCUMENTS

| DE | 102016110363 A1 | 12/2017 | |
| EP | 1037060 A2 * | 9/2000 | ............. G01R 27/06 |

(Continued)

OTHER PUBLICATIONS

Kim, Jaeseok, Automated Matching Control System Using Load Estimation and Microwave Characterization. A Dissertation Presented to the Graduate School of the University of Florida in Partial Fulfillment of the Requirements for the Degree of Doctor of Philosophy University of Florida (Year: 2008).*

(Continued)

*Primary Examiner* — Patrick Assouad
*Assistant Examiner* — Sean Curtis
(74) *Attorney, Agent, or Firm* — Murphy, Bilak & Homiller, PLLC

(57) ABSTRACT

A radio-frequency system includes an impedance tuning network having a plurality of selectable impedance states and a first port for coupling to a complex load impedance, a detector coupled to a second port of the impedance tuning network and configured to measure scalar values of reflection coefficients at the second port, and a controller configured to, for a first radio-frequency band, sequentially tune the impedance tuning network to at least three different impedance states in each of which the detector measures a scalar value of a corresponding reflection coefficient at the second port, and estimates a value of the complex load impedance based on the scalar values measured by the detector.

20 Claims, 5 Drawing Sheets

(51) Int. Cl.
*H04B 1/04* (2006.01)
*H04B 1/3827* (2015.01)

(58) Field of Classification Search
USPC .............. 324/533–534, 637, 638, 642, 646
See application file for complete search history.

(56) References Cited

U.S. PATENT DOCUMENTS

| | | | | |
|---|---|---|---|---|
| 7,865,154 | B2* | 1/2011 | Mendolia | H01P 5/04 455/125 |
| 8,140,033 | B2* | 3/2012 | Chan Wai Po | H03F 1/56 455/115.1 |
| 8,594,584 | B2* | 11/2013 | Greene | H04B 1/0458 455/77 |
| 8,600,319 | B2* | 12/2013 | Itkin | H04B 1/0458 455/107 |
| 8,630,597 | B2* | 1/2014 | Lee | H04B 1/0458 343/822 |
| 8,693,963 | B2* | 4/2014 | du Toit | H01P 5/04 455/125 |
| 8,712,340 | B2* | 4/2014 | Hoirup | H04B 1/0458 455/77 |
| 8,744,384 | B2* | 6/2014 | Mendolia | H01P 5/04 455/129 |
| 8,860,525 | B2* | 10/2014 | Manssen | H03H 7/40 333/17.3 |
| 8,860,526 | B2* | 10/2014 | Manssen | H03H 7/40 333/17.3 |
| 8,896,391 | B2* | 11/2014 | du Toit | H01P 5/04 333/17.3 |
| 9,203,500 | B2* | 12/2015 | Danak | H04B 1/40 |
| 9,431,990 | B2* | 8/2016 | du Toit | H01P 5/04 |
| 9,444,411 | B2* | 9/2016 | Scott | H01F 27/28 |
| 9,450,637 | B2* | 9/2016 | Manssen | H03H 7/40 |
| 9,564,944 | B2* | 2/2017 | Manssen | H04B 1/0475 |
| 9,584,191 | B2* | 2/2017 | Hamilton | H01Q 1/48 |
| 9,654,059 | B2* | 5/2017 | Kuo | H03F 3/19 |
| 9,660,607 | B2* | 5/2017 | Boudiaf | H03H 11/28 |
| 9,698,833 | B2* | 7/2017 | Solomko | G01R 27/06 |
| 9,716,311 | B2* | 7/2017 | Greene | H04B 1/0458 |
| 9,768,752 | B2* | 9/2017 | du Toit | H01P 5/04 |
| 9,866,244 | B2* | 1/2018 | Srirattana | H04B 1/0458 |
| 9,941,922 | B2* | 4/2018 | Manssen | H03H 7/40 |
| 9,948,270 | B2* | 4/2018 | Du Toit | H01P 5/04 |
| 9,954,564 | B2* | 4/2018 | Little | H04W 52/245 |
| 9,964,580 | B2* | 5/2018 | Boudiaf | G01R 31/50 |
| 10,063,326 | B1* | 8/2018 | Sternowski | H04B 1/04 |
| 10,088,511 | B2* | 10/2018 | Nahmanny | G01R 27/28 |
| 10,170,822 | B2* | 1/2019 | Solomko | H04B 1/04 |
| 10,218,070 | B2* | 2/2019 | Greene | H04B 1/0458 |
| 10,396,908 | B1* | 8/2019 | Sternowski | H04B 17/104 |
| 2007/0035356 | A1* | 2/2007 | Ranta | H04B 1/0458 333/17.3 |
| 2009/0253385 | A1* | 10/2009 | Dent | H04B 1/0458 455/83 |
| 2011/0254637 | A1* | 10/2011 | Manssen | H04B 1/109 333/2 |
| 2011/0254638 | A1* | 10/2011 | Manssen | H04W 24/02 333/109 |
| 2012/0032862 | A1* | 2/2012 | Ying | H01Q 1/243 343/749 |
| 2012/0112851 | A1* | 5/2012 | Manssen | H01Q 5/50 333/101 |
| 2012/0214421 | A1* | 8/2012 | Hoirup | H04B 1/401 455/67.11 |
| 2012/0295554 | A1* | 11/2012 | Greene | H01Q 1/50 455/77 |
| 2013/0135060 | A1* | 5/2013 | Lee | H03H 7/40 333/124 |
| 2014/0022556 | A1* | 1/2014 | Bruno | G01D 5/24457 356/614 |
| 2014/0266452 | A1* | 9/2014 | Scott | H03F 3/213 330/278 |
| 2014/0349593 | A1* | 11/2014 | Danak | H04B 7/12 455/77 |
| 2014/0354294 | A1* | 12/2014 | Boudiaf | G01R 35/00 324/537 |
| 2014/0378076 | A1* | 12/2014 | Manssen | H04B 1/0475 455/77 |
| 2015/0031314 | A1* | 1/2015 | Manssen | H04B 1/12 455/77 |
| 2015/0180593 | A1* | 6/2015 | Hamilton | H03F 1/565 455/107 |
| 2016/0126904 | A1* | 5/2016 | Kuo | H03F 1/56 455/127.2 |
| 2016/0277129 | A1* | 9/2016 | Manssen | H04B 1/18 |
| 2016/0373146 | A1* | 12/2016 | Manssen | H04B 15/00 |
| 2017/0077967 | A1* | 3/2017 | Srirattana | H04B 1/0458 |
| 2017/0089967 | A1* | 3/2017 | Nahmanny | G01R 27/28 |
| 2017/0141802 | A1* | 5/2017 | Solomko | G01R 27/06 |
| 2017/0230066 | A1* | 8/2017 | Little | H04B 1/401 |
| 2017/0285085 | A1* | 10/2017 | Boudiaf | H03H 7/40 |
| 2017/0352947 | A1* | 12/2017 | Solomko | H04B 1/04 |
| 2019/0253087 | A1* | 8/2019 | Domino | H03H 7/38 |
| 2019/0326094 | A1* | 10/2019 | Bhutta | H03H 7/38 |
| 2019/0355554 | A1* | 11/2019 | Ulrich | H01L 21/0262 |
| 2020/0035461 | A1* | 1/2020 | Bhutta | H01J 37/32183 |
| 2020/0083022 | A1* | 3/2020 | Huang | H03H 11/28 |
| 2020/0088773 | A1* | 3/2020 | Solomko | H03H 7/40 |
| 2020/0168439 | A1* | 5/2020 | Bhutta | C23C 16/50 |

FOREIGN PATENT DOCUMENTS

GB 2347754 A * 9/2000 ............ G01R 27/06
WO WO-9319571 A1 * 9/1993 ........ H01J 37/32963

OTHER PUBLICATIONS

Le et al., Limits of a Scalar Reflectometer Using Branch-Line Coupler and Power Detector LT5581. 2015 IEEE International RF and Microwave Conference (RFM 2015), Riverside Majestic Hotel, Kuching, Sarawak on Dec. 14-16, 2015 (Year: 2015).*
S'anchez-P'erez et al., Load Impedance Estimation for Fast and Accurate Configuration of Tunable Matching Networks.IEEE 2011 (Year: 2011).*
Gonzalez, Guillermo, "Mapping of Circles in the [S and [L Planes", Appendix J, Microwave Transistor Amplifiers: Analysis and Design (2nd Edition), ISBN-10: 0132543354, 1997, pp. 478-479.

* cited by examiner

RF IMPEDANCE MEASUREMENT AND TUNING SYSTEM

BACKGROUND

Closed-loop impedance tuning systems utilize impedance sensing during design, fabrication and operation. At the design phase, impedance sensing is used to characterize different use-cases and optimize the topology and tuning states of an impedance tuning network based on the characterization information. At the fabrication phase, impedance sensing is used to test for gross production failures. At the device operation phase, impedance sensing is used to implement closed-loop antenna tuning, including correction of the antenna feed-point impedance which may change due to user interaction, e.g., in the case of cellular handheld devices.

Complex load impedance is conventionally measured by extracting amplitude and phase information of radio-frequency (RF) signals propagating in forward and reverse directions of a signal path. Directional couplers are typically used to couple out the signal in a particular direction. The phase is usually measured by means of a mixer circuit. The mixer, however, is an active device requiring supply current in the range of several mA to operate at low-GHz frequencies. Moreover, a mixer is a nonlinear device and can inject harmonics into highly-linear transmit and receive paths. Other approaches suffer from sensing accuracy degradation along the real axes of a Smith chart, suffer from signal integrity issues and/or present a design challenge for the impedance/aperture tuner.

Thus, there is a need for an improved RF impedance measurement and tuning system.

SUMMARY

According to an embodiment of a radio-frequency system, the radio-frequency system comprises: an impedance tuning network having a plurality of selectable impedance states and a first port for coupling to a complex load impedance; a detector coupled to a second port of the impedance tuning network and configured to measure scalar values of reflection coefficients at the second port; and a controller configured to, for a first radio-frequency band, sequentially tune the impedance tuning network to at least three different impedance states in each of which the detector measures a scalar value of a corresponding reflection coefficient at the second port, and estimates a value of the complex load impedance based on the scalar values measured by the detector.

The radio-frequency system may further comprise a lookup table for storing a plurality of combinations of reflection coefficient scalar values associated with the second port of the impedance tuning network, and for each combination of reflection coefficient scalar values associated with the second port, a corresponding reflection coefficient or scalar value associated with the first port of the impedance tuning network, and wherein the controller may be configured to estimate the value of the complex load impedance by using the scalar values measured by the detector as lookup values to identify in the lookup table the reflection coefficient or scalar value for the first port which most closely corresponds to the scalar values measured by the detector.

Separately or in combination, the lookup table may include only unique combinations of reflection coefficient scalar values associated with the second port of the impedance tuning network, and for each unique combination of reflection coefficient scalar values for the second port, a corresponding reflection coefficient or scalar value associated with the first port of the impedance tuning network.

Separately or in combination, the look-up table may comprise a column of tuner states each of which yields a maximum relative transducer gain for the reflection coefficient or scalar value of the first port of the impedance tuning network associated with the tuner state.

Separately or in combination, the controller may be configured to set a tuner state of the radio-frequency system based on the tuner state stored in the lookup table and associated with the reflection coefficient or scalar value of the first port identified from the lookup table by the controller.

Separately or in combination, the difference between the maximum and the minimum of each combination of reflection coefficient scalar values stored in the lookup table for the second port of the impedance tuning network may be below a predetermined value.

Separately or in combination, the radio-frequency system may comprise a separate lookup table for each frequency band for which the controller is configured to estimate the value of the complex load impedance.

Separately or in combination, the at least three different impedance states may be selected to yield a maximum number of unique combinations of reflection coefficients associated with the second port of the impedance tuning network.

Separately or in combination, the detector may be a scalar reflectometer.

Separately or in combination, the detector may have a characteristic impedance centered on the real axis of a Smith chart so that each scalar value measured by the detector falls on a circle centered on the real axis of the Smith chart.

Separately or in combination, the impedance tuning network may comprise digitally-switchable capacitors and linear radio-frequency switches and/or inductors.

Separately or in combination, the radio-frequency system may be a cellular handheld device which includes an antenna for transmitting and/or receiving radio-frequency signals, wherein the complex load impedance is a complex impedance of the antenna, and wherein the controller may periodically re-estimate the value of the complex load impedance based on new scalar values measured by the detector.

Separately or in combination, the radio-frequency system may be an Internet of Things (IoT) device which includes an antenna for transmitting and/or receiving radio-frequency signals, and wherein the complex load impedance is a complex impedance of the antenna.

According to an embodiment of a method of radio-frequency impedance measurement in a radio-frequency system which includes an impedance tuning network having a plurality of selectable impedance states and a first port for coupling to a complex load impedance, and a detector coupled to a second port of the impedance tuning network and configured to measure scalar values of reflection coefficients at the second port, the method comprises: for a first radio-frequency band, sequentially tuning the impedance tuning network to at least three different impedance states in each of which the detector measures a scalar value of a corresponding reflection coefficient at the second port; and estimating a value of the complex load impedance based on the scalar values measured by the detector.

The method may further comprise: storing, in a lookup table, a plurality of combinations of reflection coefficient scalar values associated with the second port of the impedance tuning network, and for each combination of reflection coefficient scalar values associated with the second port, a corresponding reflection coefficient or scalar value associated with the first port of the impedance tuning network, and wherein estimating the value of the complex load impedance may comprise using the scalar values measured by the detector as lookup values to identify in the lookup table the reflection coefficient or scalar value for the first port which most closely corresponds to the scalar values measured by the detector.

Separately or in combination, the lookup table may include only unique combinations of reflection coefficient scalar values associated with the second port of the impedance tuning network, and for each unique combination of reflection coefficient scalar values for the second port, a corresponding reflection coefficient or scalar value associated with the first port of the impedance tuning network.

Separately or in combination, the look-up table may comprise a column of tuner states each of which yields a maximum relative transducer gain for the reflection coefficient or scalar value of the first port of the impedance tuning network associated with the tuner state, and the method may further comprise setting a tuner state of the radio-frequency system based on the tuner state stored in the lookup table and associated with the reflection coefficient or scalar value of the first port identified from the lookup table by the controller.

Separately or in combination, the method may further comprise using a separate lookup table for each frequency band for which the value of the complex load impedance is estimated.

According to an embodiment of a method for use in radio-frequency impedance measurement in a radio-frequency system which includes an impedance tuning network having a plurality of selectable impedance states and first and second ports, and a detector coupled to the second port of the impedance tuning network and configured to measure scalar values of reflection coefficients at the second port, the method comprises: sequentially coupling a plurality of known complex load impedances to the first port of the impedance tuning network; applying a radio-frequency signal to each known complex load impedance through the detector and the impedance tuning network; for each known complex load impedance, sequentially tuning the impedance tuning network to at least three different impedance states and measuring a scalar value of a corresponding reflection coefficient at the second port of the impedance tuning network via the detector for each impedance state of the impedance tuning network; and for each known complex load impedance, associating the scalar values measured by the detector and the corresponding known complex load impedance.

For each known complex load impedance, the scalar values measured by the detector may be associated with the corresponding known complex load impedance in a lookup table.

The method may further comprise storing, in the lookup table, only unique combinations of reflection coefficient scalar values associated with the second port of the impedance tuning network, and for each unique combination of reflection coefficient scalar values for the second port, a corresponding reflection coefficient or scalar value associated with the first port of the impedance tuning network.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein relate to the area of antenna tuning, particularly to closed-loop impedance estimating and tuning. The embodiments described herein implement a complex impedance sensing function using an impedance tuning network and a detector such as a scalar reflectometer. The complex value of a load impedance is measured using the detector and the impedance tuning network. The impedance tuning network is tuned, via a controller, to at least three different known impedance states which result in at least three different S-parameters (scattering parameters). The S-parameter elements describe the electrical behavior of the impedance tuning network when undergoing various steady-state stimuli by electrical signals. For each known impedance state of the impedance tuning network, the detector measures a scalar value of a corresponding reflection coefficient at a measurement port of the impedance tuning network. The controller uses the measured values of scalar reflection coefficients to estimate the complex load impedance, e.g., from a look-up table, and to optionally tune the RF system based on the estimated complex load impedance.

Figure 1:
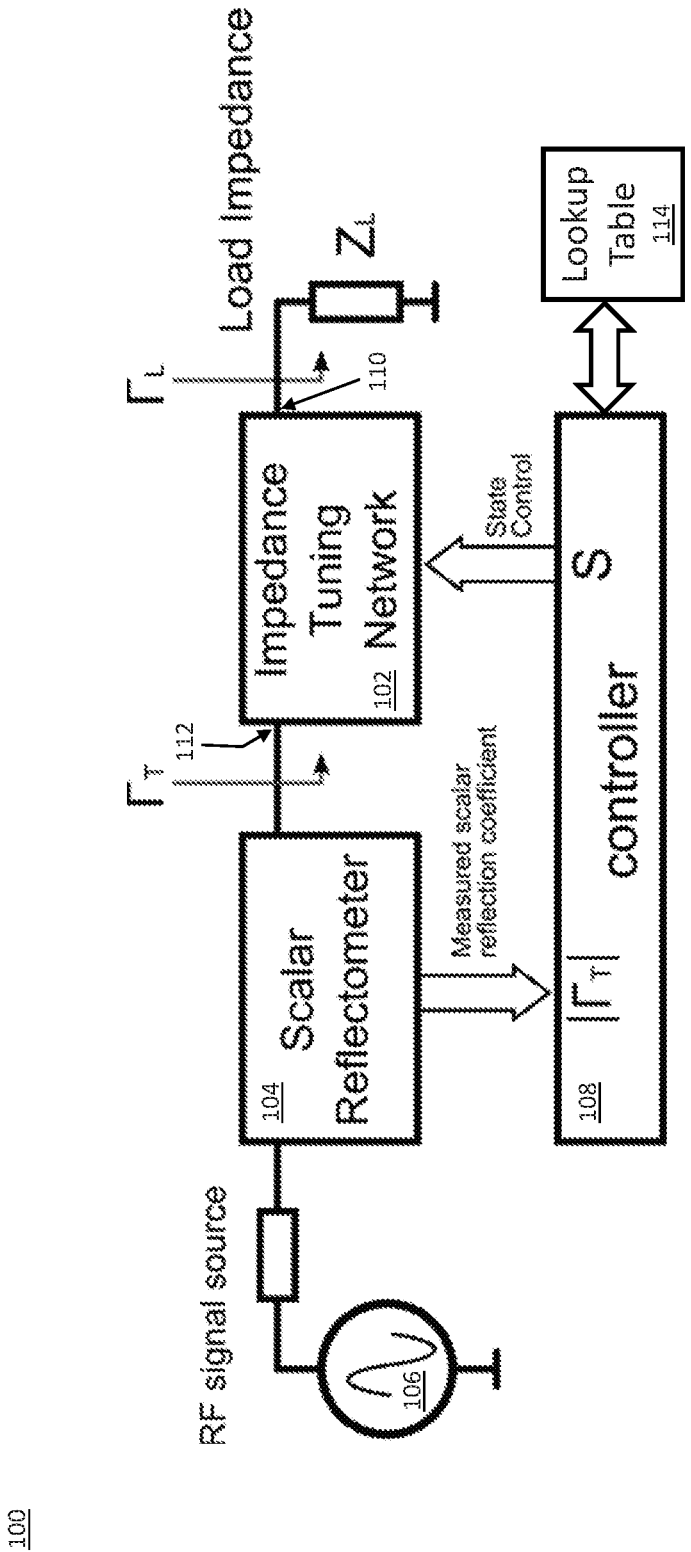
FIG. 1 illustrates a block diagram of an embodiment of an RF impedance measurement and tuning system.

FIG. 1 illustrates an embodiment of an RF impedance measurement and tuning system 100. The RF impedance measurement and tuning system 100 includes an impedance tuning network 102, a detector 104, an RF signal source 106 and a controller 108. The impedance tuning network 102 has a load port 110 for coupling to a complex load impedance $Z_L$ and a measurement port 112 for coupling to the detector 104. The load $Z_L$ has a reflection coefficient $\Gamma_L$ which is unknown. The impedance tuning network 102 has a plurality of selectable impedance states, at least three of which are sequentially selected by the controller 108 as part of the closed-loop impedance estimating process described herein. The detector 104 measures scalar values $|\Gamma_T|$ of corresponding reflection coefficients $\Gamma_T$ at the measurement port 112 of the impedance tuning network 102 for the different impedance states selected by the controller 108.

Any detector capable of measuring scalar values $|\Gamma_T|$ of reflection coefficients $\Gamma_T$ may be used. For example, the detector 104 may be a scalar reflectometer implemented using a diode-based detector and a directional coupler, a VSWR (Voltage Standing Wave Ratio) detector, etc. A scalar reflectometer, for example, is suitable for measuring the magnitude $|\Gamma_T|$ of a reflection coefficient $\Gamma_T$ at RF frequencies, including microwave frequencies. Measurement of an unknown complex impedance at microwave frequencies depends on the ability of the detector 104 to measure incident and reflected signals from the load $Z_L$. For measurements of scalar quantities, e.g. $|\Gamma_T|$ without phase information, the detector 104 measures magnitudes of incident and reflected microwave power. A full scalar reflectometer separates forward and reverse traveling waves that are present in a transmission line, so that the power carried by these waves can be measured separately. This separation may be achieved, e.g., using a directional coupler. Directional couplers are passive, transmission line-based devices that separate forward and reverse waves through multiple weakly coupled sections of a transmission line. The undesired component (forward or reverse) destructively interferes with itself in the multiple coupled sections, resulting in only the desired component to remain on the coupled line. A dual directional coupler isolates both the forward and reverse waves, and routes the forward and reverse waves to separate ports on the detector 104.

Any programmable impedance tuning network having a plurality of selectable impedance states may be used. For example, the impedance tuning network 102 may include digitally-switchable (tuned) capacitors and linear RF switches and/or inductors. The inductors and capacitors may be integrated on a chip (semiconductor die), disposed in a module or package, or may be external components such as surface-mount devices (SMDs). The switches of the impedance tuning network 102 are used to switch ON and OFF externally-connected SMD components.

The controller 108 may be implemented using a combination of analog hardware components (such as transistors, amplifiers, diodes, and resistors), and processor circuitry that includes primarily digital components. The processor circuitry may include one or more of a digital signal processor (DSP), a general-purpose processor, and an application-specific integrated circuit (ASIC). The controller may also include memory, e.g., non-volatile memory such as flash, that includes instructions or data for use by the processor circuitry, one or more timers, one or more registers, etc.

Figure 2:
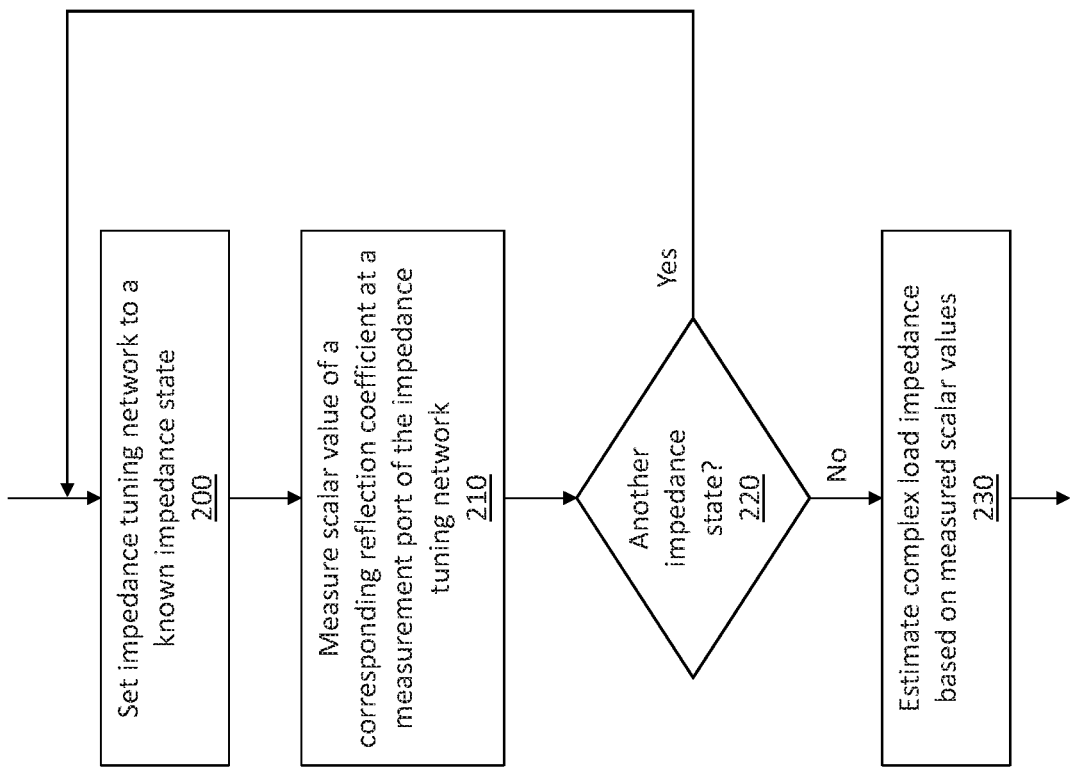
FIG. 2 illustrates a flow diagram of an embodiment of a closed-loop impedance estimating process performed by the RF impedance measurement and tuning system shown in FIG. 1.

FIG. 2 illustrates an embodiment of the closed-loop impedance estimating process performed by the RF impedance measurement and tuning system 100. For each RF band of interest, the controller 108 tunes the impedance tuning network 102 to a first known impedance state (Block 200). The first known impedance state selected by the controller 108 corresponds to an S-parameter $S1$ of the impedance tuning network 102, $S1$ describing the electrical behavior of the impedance tuning network 102 when undergoing various steady-state stimuli by electrical signals generated by the RF signal source 106, and which produces a reflection coefficient $\Gamma_{T1}$ at the measurement port 112 of the impedance tuning network 102. While the impedance tuning network 102 is tuned to the first known impedance state, the detector 104 measures a scalar value $|\Gamma_{T1}|$ of the corresponding reflection coefficient $\Gamma_{T1}$ at the measurement port 112 of the impedance tuning network 102 (Block 210). The controller 108 determines whether the impedance tuning network 102 has been sequentially tuned to at least three different impedance states (Block 220). For example, the controller 108 may include a counter which is incremented each time the impedance tuning network 102 is tuned to a different impedance state (state m) and the detector 104 measures a scalar value $|\Gamma_{Tm}|$ of the corresponding reflection coefficient $\Gamma_{Tm}$ at the measurement port 112 of the impedance tuning network 102. If the impedance tuning network 102 has not been tuned to at least three known impedance states, the controller 108 tunes the impedance tuning network 102 to a new impedance state (state n) and the detector 104 measures a scalar value $|\Gamma_{Tn}|$ of the corresponding reflection coefficient $\Gamma_{Tn}$ at the measurement port 112 of the impedance tuning network 102 (Blocks 200 and 210).

After the impedance tuning network 102 has been tuned to at least three different impedance states and the detector 104 has measured scalar values of the corresponding reflection coefficients at the measurement port 112 of the impedance tuning network 102, the controller 108 estimates a value $\Gamma_L$ of the complex load impedance $Z_L$ coupled to the load port 110 of the impedance tuning network 102, based on at least three scalar values $|\Gamma_{T1}|, |\Gamma_{T2}|, |\Gamma_{T3}|$ measured by the detector 104 (Block 230). In one embodiment, the RF system 100 includes a lookup table 114 included in or associated with the controller 108. The lookup table 114 stores a plurality of combinations of reflection coefficient scalar values $|\Gamma_{T1'}|, |\Gamma_{T2'}|, |\Gamma_{T3'}|$ . . . associated with the measurement port 112 of the impedance tuning network 102, and for each combination of reflection coefficient scalar values associated with the measurement port 112, a corresponding reflection coefficient $\Gamma_{L'}$ or scalar value $|\Gamma_{L'}|$ associated with the load port 110 of the impedance tuning network 102. The controller 108 estimates the value $\Gamma_L$ of the complex load impedance $Z_L$ by using the at least three scalar values $|\Gamma_{T1}|, |\Gamma_{T2}|, |\Gamma_{T3}|$ measured by the detector 104 as lookup values to identify in the lookup table 114 the reflection coefficient $\Gamma_{L'}$ or corresponding scalar value $|\Gamma_{L'}|$ for the load port 110 of the impedance tuning network 102 which most closely corresponds to the scalar values measured by the detector 104. Table 1 below illustrates an embodiment of the lookup table 114.

TABLE 1

Exemplary Lookup Table Mapping Combinations of Scalar Values to Individual Load Reflection Coefficients

| $|\Gamma_{T1'}|$ | $|\Gamma_{T2'}|$ | $|\Gamma_{T3'}|$ | $\Gamma_{L'}$ | Tuner State |
|---|---|---|---|---|
| 0.15 | 0.4 | 0.5 | 0.5 + j0.5 | State 1 |
| 0.9 | 0.71 | 0.88 | 0.3 − j0.9 | State 2 |
| . . . | . . . | . . . | . . . | . . . |

The lookup table search performed by the controller 108 identifies the combination of reflection coefficient scalar values $|\Gamma_{T1'}|, |\Gamma_{T2'}|, |\Gamma_{T3'}|$ . . . stored in the table 114 and which most closely match the scalar values $|\Gamma_{T1}|, |\Gamma_{T2}|, |\Gamma_{T3}|$ . . . measured by the detector 104, and returns the corresponding reflection coefficient $\Gamma_{L'}$ or scalar value $|\Gamma_{L'}|$ as representative of the complex load impedance $Z_L$. The controller 108 may extrapolate the reflection coefficient $\Gamma_{L'}$ or corresponding scalar value $|\Gamma_{L'}|$ for the load $Z_L$ if the scalar values $|\Gamma_{T1}|, |\Gamma_{T2}|, |\Gamma_{T3}|$ . . . measured by the detector 104 are not stored in the lookup table 114. The lookup table 114 effectively performs an impedance transformation from a known reference plane of the Smith chart to an unknown plane at which the complex impedance of the load $Z_L$ is located.

The accuracy of the impedance measurement over the Smith chart location does not degrade along the real impedance axes, but is correlated with transducer gain of the impedance tuning network 102. The detector 104 may not directly face the load impedance $Z_L$, but may be located after the impedance tuning network 102, enabling closed-loop tuning, as opposed to an architecture where the detector 104 is attached directly to the load impedance $Z_L$.

Figure 3:
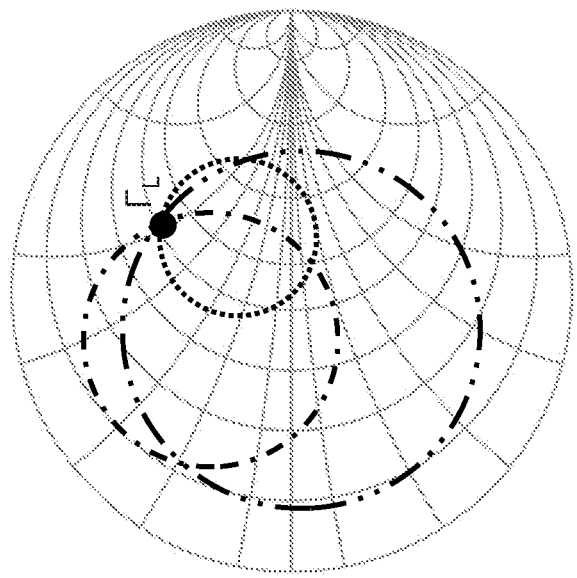
FIG. 3 illustrates a chart diagram of an embodiment of the closed-loop impedance estimating process, using a lookup table.
Figure 3:
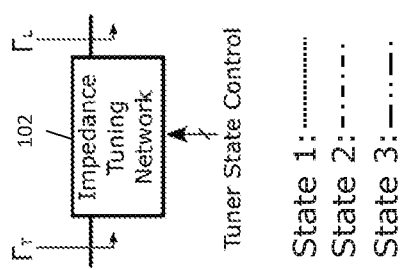
Figure 3:
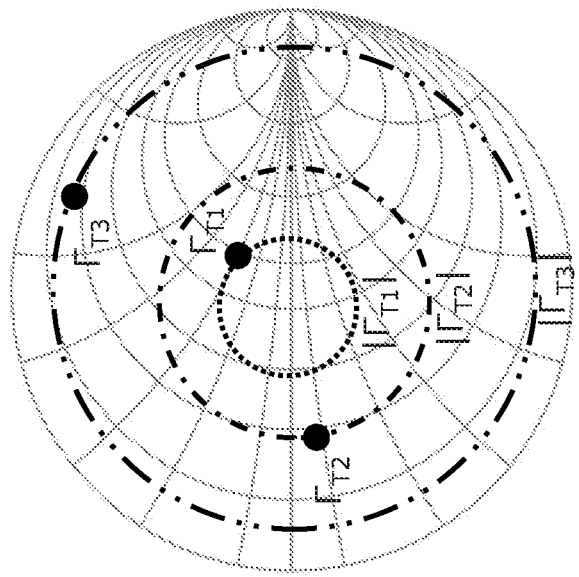

FIG. 3 illustrates an embodiment in which the detector 104 is centered on the real axis of the Smith chart and therefore has a characteristic impedance, so that each scalar value measured by the detector 104 falls on a circle centered on the real axis of the Smith chart. The right-hand side of FIG. 3 shows the complex reflection coefficient $\Gamma_L$ for the load impedance and which has an unknown positive imaginary part. The left-hand side of FIG. 3 shows three reflection coefficients $\Gamma_{T1}$, $\Gamma_{T2}$, and $\Gamma_{T3}$ associated with three different (known) impedance states of the impedance tuning network 102. The impedance tuning network 102 is sequentially tuned to these states by the controller 108 as part of the closed-loop impedance estimating process.

Each impedance state corresponds to a unique set of S-parameters for the two-port impedance tuning network 102. When loaded with an unknown impedance $Z_L$ having a reflection coefficient $\Gamma_L$, the impedances at the measurement port 112 of the impedance tuning network 102 produce three reflection coefficients $\Gamma_{T1}$, $\Gamma_{T2}$, $\Gamma_{T3}$. When the corresponding scalar values $|\Gamma_{T1}|$, $|\Gamma_{T2}|$, $|\Gamma_{T3}|$ of the reflection coefficients $\Gamma_{T1}$, $\Gamma_{T2}$, $\Gamma_{T3}$ are sequentially measured by a scalar reflectometer type detector 104, three constant VSWR circles each centered in the middle of the Smith chart are produced as shown on the left-hand side of FIG. 2. The radii of the circles are $|\Gamma_{T1}|$, $|\Gamma_{T2}|$, $|\Gamma_{T3}|$, correspondingly. The constant VSWR circles may be measured for more than three known impedance states of the impedance tuning network 102, to add redundancy to the measurement system and reduce probability of false measurements. Hence, the use of ' . . . ' after $|\Gamma_{T1}|$, $|\Gamma_{T2}|$, $|\Gamma_{T3}|$. However, only three known impedance states of the impedance tuning network 102 may be used to estimate the value of the complex load impedance.

Multiple points along the constant VSWR circles can be mapped back to the $\Gamma_L$ plane on the right-hand side of FIG. 3, but the VSWR circles are not centered in the Smith chart in the $\Gamma_L$ plane because the mapping represents an impedance transformation and the load impedance $Z_L$ is complex. Mathematically, the mapping may be done using bilinear transformation. The constant VSWR circles in the $\Gamma_L$-plane cross at a point $\Gamma_L$ as shown in FIG. 3, which represents the reflection coefficient of the complex load $Z_L$ coupled to the load port 110 of the impedance tuning network 102. When $|\Gamma_{T1}|$, $|\Gamma_{T2}|$, $|\Gamma_{T3}|$ are known (measured), $\Gamma_L$ or $|\Gamma_L|$ can be calculated or extracted from the look-up table 114. For each measurement, the state of impedance of the tuning network 102 is changed and therefore the S-parameters change, and another constant VSWR circle is measured in the center of the Smith chart on the left-hand side of FIG. 3 which can be mapped back to the $\Gamma_L$ plane on the right-hand side of FIG. 3. The controller 108 then finds the intersecting point for all three (or more) VSWR circles to identify the complex load impedance using the lookup table 114.

In one embodiment, the lookup table 114 includes only unique combinations of reflection coefficient scalar values $|\Gamma_{T1}|$, $|\Gamma_{T2}|$, $|\Gamma_{T3}|$ . . . associated with the measurement port 112 of the impedance tuning network 102, and for each unique combination of reflection coefficient scalar values, a corresponding reflection coefficient $\Gamma_L$, or scalar value $|\Gamma_L|$ associated with the load port 110 of the impedance tuning network 102. The selection process may be implemented by sweeping all reflection coefficients to cover the complete Smith chart for all possible permutations of the three or more impedance network tuning states.

The lookup table 114 is frequency-dependent. A different lookup table 114 may be generated for each frequency band of interest. That is, a separate lookup table 114 may be provided for each frequency band of interest. Instead, a single lookup table 114 may be segmented and accessible by frequency band. In the case of the 5G (fifth-generation wireless) protocol, there may be a separate lookup table 114 for each of 40 different frequency bands, or instead a single lookup table 114 segmented and accessible across all 40 bands. The size of the lookup table 114 depends on various factors, and may have, e.g., 100 to 200 entries for a particular frequency band of interest. The lookup table 114 may have less than 100 entries or more than 200 entries. If memory space is constrained, redundant entries may be eliminated to reduce table size.

The lookup table 114 may be optimized so that the difference in scalar values of the measured reflection coefficients is limited. That is, the tuning states for the impedance tuning network 102 may be selected such that the tuning states do not produce large $|\Gamma_L|$ variations between the states ($|\Gamma_L|$ varies in the range 0 . . . 1). The difference between the minimum and maximum scalar values of the scalar reflection coefficients $|\Gamma_{T1'}|$, $|\Gamma_{T2'}|$, $|\Gamma_{T3'}|$ . . . stored in the lookup table 114 may be limited. For example, the following states may be considered acceptable and unacceptable given an example maximum difference of 0.5:

TABLE 2

Exemplary Acceptable $|\Gamma_{L'}|$ Variations

| $|\Gamma_{T1'}|$ | $|\Gamma_{T2'}|$ | $|\Gamma_{T3'}|$ | Max difference |
|---|---|---|---|
| 0.1 | 0.4 | 0.22 | 0.4 − 0.1 = 0.3 |
| 0.95 | 0.62 | 0.77 | 0.95 − 0.62 = 0.33 |
| 0.45 | 0.6 | 0.55 | 0.6 − 0.45 = 0.15 |

TABLE 3

Exemplary Unacceptable $|\Gamma_{L'}|$ Variations

| $|\Gamma_{T1'}|$ | $|\Gamma_{T2'}|$ | $|\Gamma_{T3'}|$ | Max difference |
|---|---|---|---|
| 0.1 | 0.9 | 0.5 | 0.9 − 0.1 = 0.8 |
| 0.95 | 0.05 | 0.3 | 0.95 − 0.05 = 0.9 |
| 0.45 | 0.66 | 0.1 | 0.66 − 0.1 = 0.56 |

In this example, the difference between the lowest and highest values of the scalar reflection coefficients $|\Gamma_{T1'}|$, $|\Gamma_{T2'}|$, $|\Gamma_{T3'}|$ . . . stored in the lookup table 114 is less than 0.5. A threshold value above or below 0.5 may be used instead. If above the threshold, the corresponding tuning impedance values are not used. That is, these settings of the impedance matching network 102 are not included in lookup table 114 and therefore not used/permitted as part of the closed-loop impedance estimating process described herein.

According to another embodiment, the value of the complex load impedance is estimated based on the scalar values using an analytical calculation of the crossing point of three circles in $\Gamma_L$-plane. The $\Gamma_L$-plane is shown in the right-hand of FIG. 3. The circle on the $\Gamma_L$-plane corresponding to 'State 1' may be described with the following equation:

$$(\Re\{\Gamma\} - \Re\{\Gamma_{C1}\})^2 + (\Im\{\Gamma\} - \Im\{\Gamma_{C1}\})^2 = R_{C1}^2 \quad (1)$$

where complex variable $\Gamma$ denotes any point located on the circle, $\Re\{\Gamma\}$ and $\Im\{\Gamma\}$ are real and imaginary values of the complex variable $\Gamma$, respectively, $\Gamma_{C1}$ is a point on the $\Gamma_L$-plane where the center of the circle is located, and $R_{C1}$ is a real number representing the radius of the circle. The other two circles on the $\Gamma_L$-plane may be described using the same equation, respectively.

The complex load reflection coefficient $\Gamma_L$ is a point common to all three circles and may be found by solving the following system of equations:

$$\begin{cases} (\Re\{\Gamma_L\} - \Re\{\Gamma_{C1}\})^2 + (\Im\{\Gamma_L\} - \Im\{\Gamma_{C1}\})^2 = R_{C1}^2 \\ (\Re\{\Gamma_L\} - \Re\{\Gamma_{C2}\})^2 + (\Im\{\Gamma_L\} - \Im\{\Gamma_{C2}\})^2 = R_{C2}^2 \\ (\Re\{\Gamma_L\} - \Re\{\Gamma_{C3}\})^2 + (\Im\{\Gamma_L\} - \Im\{\Gamma_{C3}\})^2 = R_{C3}^2 \end{cases} \quad (2)$$

The system of equations in (2) may be solved for $\Re\{\Gamma_L\}$ and $\Im\{\Gamma_L\}$. The load reflection coefficient is given by:

$$\Gamma_L = \Re\{\Gamma_L\} + j \cdot \Im\{\Gamma_L\} \quad (3)$$

Figure 4:
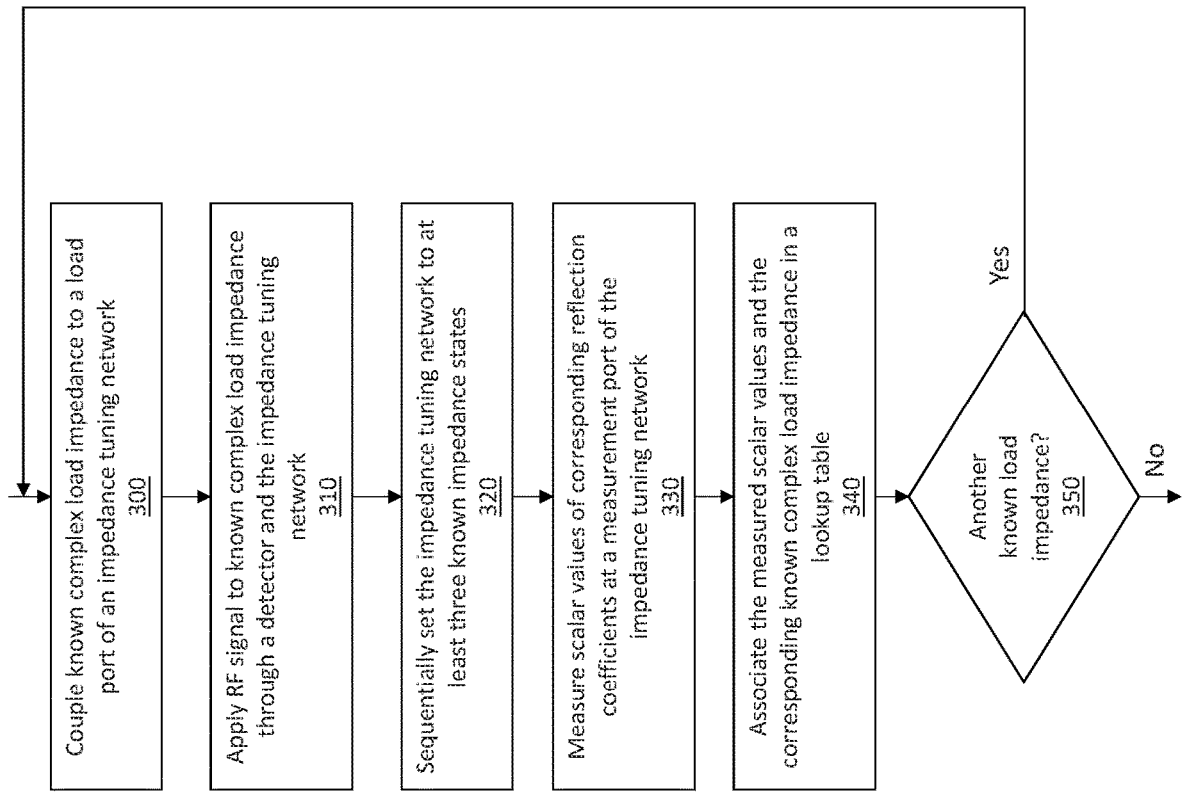
FIG. 4 illustrates a flow diagram of an embodiment of generating the lookup table.

FIG. 4 illustrates an embodiment of generating the data used to estimate the load impedance. In case a lookup table 114 is used, the data may be stored in the lookup table 114. The data instead may be used to estimate the load impedance using equations (1)-(3). For each frequency band of interest, a known complex impedance is coupled to the load port 110 of the impedance tuning network 102 (Block 300). An RF signal is applied to the known complex load impedance by the RF signal source 106 through the detector 104 and the impedance tuning network 102 (Block 310). The impedance tuning network 102 is then sequentially tuned to at least three different impedance states (Block 320), and the detector 104 measures a scalar value $|\Gamma_{T1}|$ of a corresponding reflection coefficient $\Gamma_{T1}$ at the measurement port 112 of the impedance tuning network 102 for each impedance state of the impedance tuning network 102 (Block 330), e.g., as previously described herein in connection with FIG. 2. For each known complex load impedance being used, the scalar values measured by the detector 104 and the corresponding known complex load impedance may be associated in the lookup table 114 (Block 340), e.g., as previously described herein in connection with Tables 1-3, or used in a different way for estimating the load impedance. The process may be repeated for one or more additional known complex load impedances (Block 350). The tuning state of an RF system may be set, e.g., using the lookup table 114.

Figure 5:
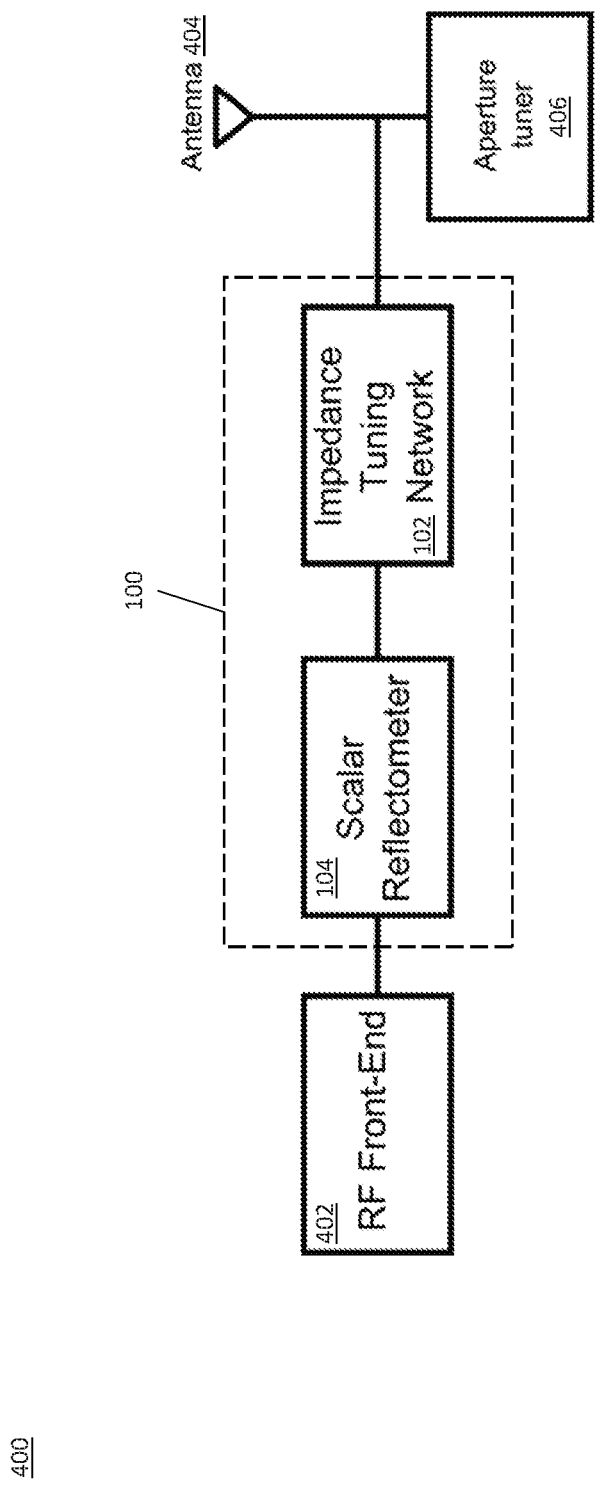
FIG. 5 illustrates a block diagram of an embodiment of an RF system which includes the RF impedance measurement and tuning system shown in FIG. 1.

FIG. 5 illustrates an embodiment of an RF system 400 having a tuning state which may be set using a lookup table 114 of the kind described herein. The system 400 includes RF front-end circuitry 402, the RF impedance measurement and tuning system 100 shown in FIG. 1, an antenna 404 for transmitting and/or receiving radio-frequency signals, and an aperture tuner 406 for tuning or matching the complex impedance of the RF front-end circuitry 402 to the complex impedance of the antenna 404. The RF front-end circuitry 402, the RF impedance measurement and tuning system 100 and the aperture tuner 406 may be controlled using a standard 2-wire MIPI interface. Information about the measured scalar values at the impedance tuning network 102 may be transmitted to the controller 108 (not shown in FIG. 5 for ease of illustration) via the two-wire MIPI interface. The scalar reflectometer-based detector 104 and the impedance tuning network 102 may be located in close physical proximity to each other or may even be integrated on the same chip with the aperture tuner 406, such that RF calibration is not necessary at the system level.

In one embodiment, the RF system 400 is a cellular handheld device. The closed-loop impedance estimating process described herein may be implemented to estimate the complex impedance of the antenna 404, and the aperture tuner 406 may tune or match the complex impedance of the RF front-end circuitry 402 to the estimated complex impedance of the antenna 404. In one embodiment, the look-up table 114 (not shown in FIG. 5 for ease of illustration) further includes a column of tuner states, e.g., as shown in Table 1. Each tuner state yields a maximum relative transducer gain for the reflection coefficient $\Gamma_L$, of the load port 110 of the impedance tuning network 102 associated with the tuner state. The controller 108 may set a tuner state of the RF system 400 based on the tuner state stored in the lookup table 114 and associated with the reflection coefficient $\Gamma_L$, or scalar value $|\Gamma_L|$ of the load port 110 identified from the lookup table 114 by the controller 108. For example, the gain state stored in the lookup table 114 and corresponding to the estimated complex impedance of the antenna 404 may be used to set a maximum relative transducer gain for the RF front-end circuitry 402. The controller 108 may instead calculate the maximum relative transducer gain based on the estimated complex impedance of the antenna 404 retrieved from the lookup table 114. In either case, the controller 108 may periodically re-estimate the value of the complex load impedance based on new scalar values measured by the detector 104, by reinitiating the closed-loop impedance estimating process.

In another embodiment, the RF system 400 is an Internet of Things (IoT) device. An IoT device is a physical device, vehicle, home appliance or other item embedded with electronics, software, sensors, actuators and connectivity which enables the device to connect and exchange data. Still other types of RF systems are contemplated.

Depending on the type of RF system 400, the closed-loop impedance estimating process may be performed a single time or more than once. For example, in the case of a cellular handheld device, the closed-loop impedance estimating process may be performed periodically to correct the antenna feed-point impedance which changes due to user interaction with the device. In the case of an IoT device, the closed-loop impedance estimating process may be performed once over the lifetime of the device, or periodically to account for the effect of environmental changes, e.g., temperature, etc. on the impedance.

The closed-loop impedance estimating process enables a semi-autonomous closed-loop antenna tuning system, and may also be utilized in the design-in phase where a scalar reflectometer type detector can be used to characterize antenna impedances for various use cases of interest and to optimize the tuner topology for achieving best relative transducer gain for a closed-loop antenna tuning system.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A radio-frequency system, comprising:
an impedance tuning network having a plurality of selectable impedance states and a first port for coupling to a complex load impedance;
a detector coupled to a second port of the impedance tuning network and configured to measure scalar values of reflection coefficients at the second port;
a controller configured to, for a first radio-frequency band, sequentially tune the impedance tuning network to at least three different impedance states in each of which the detector measures a scalar value of a corresponding reflection coefficient at the second port, and estimates a value of the complex load impedance based on the scalar values measured by the detector; and
a lookup table configured to store a plurality of combinations of reflection coefficient scalar values associated with the second port of the impedance tuning network, and for each combination of reflection coefficient scalar values associated with the second port, a corresponding reflection coefficient scalar value associated with the first port of the impedance tuning network,
wherein the controller is configured to estimate the value of the complex load impedance by using the scalar values measured by the detector as lookup values to identify in the lookup table the reflection coefficient or scalar value for the first port which most closely corresponds to the scalar values measured by the detector.

2. The radio-frequency system of claim 1, wherein the lookup table includes only unique combinations of reflection coefficient scalar values associated with the second port of the impedance tuning network, and for each unique combination of reflection coefficient scalar values for the second port, a corresponding reflection coefficient or scalar value associated with the first port of the impedance tuning network.

3. The radio-frequency system of claim 1, wherein the look-up table comprises a column of tuner states each of which yields a maximum relative transducer gain for the reflection coefficient or scalar value of the first port of the impedance tuning network associated with the tuner state.

4. The radio-frequency system of claim 3, wherein the controller is configured to set a tuner state of the radio-frequency system based on the tuner state stored in the lookup table and associated with the reflection coefficient or scalar value of the first port identified from the lookup table by the controller.

5. The radio-frequency system of claim 1, wherein a difference between the maximum and the minimum of each combination of reflection coefficient scalar values stored in the lookup table for the second port of the impedance tuning network is below a predetermined value.

6. The radio-frequency system of claim 1, wherein the radio-frequency system comprises a separate lookup table for each frequency band for which the controller is configured to estimate the value of the complex load impedance.

7. The radio-frequency system of claim 1, wherein the at least three different impedance states are selected to yield a maximum number of unique combinations of reflection coefficients associated with the second port of the impedance tuning network.

8. The radio-frequency system of claim 1, wherein the detector is a scalar reflectometer.

9. The radio-frequency system of claim 1, wherein the detector has a characteristic impedance centered on the real axis of a Smith chart so that each scalar value measured by the detector falls on a circle centered on the real axis of the Smith chart.

10. The radio-frequency system of claim 1, wherein the impedance tuning network comprises digitally-switchable capacitors and linear radio-frequency switches and/or inductors.

11. The radio-frequency system of claim 1, wherein the radio-frequency system is a cellular handheld device which includes an antenna for transmitting and/or receiving radio-frequency signals, wherein the complex load impedance is a complex impedance of the antenna, and wherein the controller periodically re-estimates the value of the complex load impedance based on new scalar values measured by the detector.

12. The radio-frequency system of claim 1, wherein the radio-frequency system is an Internet of Things (IoT) device which includes an antenna for transmitting and/or receiving radio-frequency signals, and wherein the complex load impedance is a complex impedance of the antenna.

13. A method of radio-frequency impedance measurement in a radio-frequency system which includes an impedance tuning network having a plurality of selectable impedance states and a first port for coupling to a complex load impedance, and a detector coupled to a second port of the impedance tuning network and configured to measure scalar values of reflection coefficients at the second port, the method comprising:
for a first radio-frequency band, sequentially tuning the impedance tuning network to at least three different impedance states in each of which the detector measures a scalar value of a corresponding reflection coefficient at the second port; and
estimating a value of the complex load impedance based on the scalar values measured by the detector; and
storing, in a lookup table, a plurality of combinations of reflection coefficient scalar values associated with the second port of the impedance tuning network, and for each combination of reflection coefficient scalar values associated with the second port, a corresponding reflection coefficient or scalar value associated with the first port of the impedance tuning network,
wherein estimating the value of the complex load impedance comprises using the scalar values measured by the detector as lookup values to identify in the lookup table the reflection coefficient or scalar value for the first port which most closely corresponds to the scalar values measured by the detector.

14. The method of claim 13, wherein the lookup table includes only unique combinations of reflection coefficient scalar values associated with the second port of the impedance tuning network, and for each unique combination of reflection coefficient scalar values for the second port, a corresponding reflection coefficient or scalar value associated with the first port of the impedance tuning network.

15. The method of claim 13, wherein the look-up table comprises a column of tuner states each of which yields a maximum relative transducer gain for the reflection coefficient or scalar value of the first port of the impedance tuning network associated with the tuner state, the method further comprising:
setting a tuner state of the radio-frequency system based on the tuner state stored in the lookup table and associated with the reflection coefficient or scalar value of the first port identified from the lookup table by the controller.

16. The method of claim 13, further comprising:
using a separate lookup table for each frequency band for which the value of the complex load impedance is estimated.

17. A method for use in radio-frequency impedance measurement in a radio-frequency system which includes an impedance tuning network having a plurality of selectable impedance states and first and second ports, and a detector coupled to the second port of the impedance tuning network and configured to measure scalar values of reflection coefficients at the second port, the method comprising:
sequentially coupling a plurality of known complex load impedances to the first port of the impedance tuning network;
applying a radio-frequency signal to each known complex load impedance through the detector and the impedance tuning network;
for each known complex load impedance, sequentially tuning the impedance tuning network to at least three different impedance states and measuring a scalar value of a corresponding reflection coefficient at the second port of the impedance tuning network via the detector for each impedance state of the impedance tuning network; and
for each known complex load impedance, associating the scalar values measured by the detector and the corresponding known complex load impedance.

18. The method of claim 17, wherein for each known complex load impedance, the scalar values measured by the detector are associated with the corresponding known complex load impedance in a lookup table.

19. The method of claim 18, further comprising:
storing, in the lookup table, only unique combinations of reflection coefficient scalar values associated with the second port of the impedance tuning network, and for each unique combination of reflection coefficient scalar values for the second port, a corresponding reflection coefficient or scalar value associated with the first port of the impedance tuning network.

20. A radio-frequency system, comprising:
an impedance tuning network having a plurality of selectable impedance states and a first port for coupling to a complex load impedance;
a detector coupled to a second port of the impedance tuning network and configured to measure scalar values of reflection coefficients at the second port; and
a controller configured to, for a first radio-frequency band, sequentially tune the impedance tuning network to at least three different impedance states in each of which the detector measures a scalar value of a corresponding reflection coefficient at the second port, and estimates a value of the complex load impedance based on the scalar values measured by the detector,
wherein the at least three different impedance states are selected to yield a maximum number of unique combinations of reflection coefficients associated with the second port of the impedance tuning network.

* * * * *

UNITED STATES PATENT AND TRADEMARK OFFICE
CERTIFICATE OF CORRECTION

PATENT NO. : 10,816,581 B2
APPLICATION NO. : 16/132816
DATED : October 27, 2020
INVENTOR(S) : Solomko et al.

Page 1 of 1

It is certified that error appears in the above-identified patent and that said Letters Patent is hereby corrected as shown below:

In the Claims

Column 12, Line 37 (Claim 13, Line 13) please change "port; and" to -- port; --

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*